US006889108B2

(12) United States Patent
Tanaka et al.

(10) Patent No.: US 6,889,108 B2
(45) Date of Patent: May 3, 2005

(54) PROCESSING SYSTEM AND PROCESSING METHOD

(75) Inventors: Osamu Tanaka, Tosu (JP); Kenji Todoroki, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/338,490

(22) Filed: Jan. 7, 2003

(65) Prior Publication Data

US 2003/0130754 A1 Jul. 10, 2003

(30) Foreign Application Priority Data

Jan. 8, 2002 (JP) ........................................ 2002-001206

(51) Int. Cl.[7] .............................................. G06F 19/00
(52) U.S. Cl. ..................... 700/112; 700/121; 700/228
(58) Field of Search ................................. 700/112, 218, 700/121, 228; 901/47; 134/25.4

(56) References Cited

U.S. PATENT DOCUMENTS

| 4,830,888 A | | 5/1989 | Kobayashi et al. | |
| 4,919,073 A | | 4/1990 | Kobayashi et al. | |
| 5,950,643 A | * | 9/1999 | Miyazaki et al. | .......... 134/25.4 |
| 6,146,468 A | * | 11/2000 | Dryer et al. | ................... 134/10 |
| 6,200,387 B1 | * | 3/2001 | Ni | ............................... 118/722 |
| 6,339,730 B1 | * | 1/2002 | Matsushima | ................. 700/218 |

FOREIGN PATENT DOCUMENTS

JP              3254520            11/2001

* cited by examiner

*Primary Examiner*—Jayprakash N. Gandhi
(74) *Attorney, Agent, or Firm*—Morrison & Foerster LLP

(57) ABSTRACT

The present invention is to provide a processing system and a processing method which do not require the selection of processing recipes by operators and can provide high throughputs.

The processing system for processing an object group of one object-to-be-processed, or two or more objects-to-be-processed in a processing vessel with a processing liquid, comprises a plurality of processing vessel groups M1, M2, M3 each of at least one or more processing vessels, which can perform the same processing; transportation apparatus 22 for transporting object groups WS to the plurality of processing vessel groups; and a control unit 45 for selecting the processing vessel groups M1, M2, M3 for the object groups WS to be transported to, the control unit 45 having an applying function of applying processing recipes for the respective object groups and a selecting function of selecting the processing vessel groups for executing the respective applied processing recipes in a prescribed sequence.

19 Claims, 8 Drawing Sheets

| PROCESSING VESSELS | SEQUENCE | NAME OF PROCESSING |
|---|---|---|
| CHEMICAL LIQUID PROCESSING VESSEL P1 | 1 | CLEANING |
| WATER RINSE PROCESSING VESSEL R1 | 2 | WATER RINSE |
| CHEMICAL LIQUID PROCESSING VESSEL P2 | 3 | CLEANING |
| WATER RINSE PROCESSING VESSEL R2 | 4 | WATER RINSE |
| CHEMICAL LIQUID PROCESSING VESSEL P3 | 5 | CLEANING |
| WATER RINSE PROCESSING VESSEL R3 | 6 | WATER RINSE |
| DRYING UNIT | 7 | DRYING |

FIG.4

| PROCESSING VESSELS | SEQUENCE | NAME OF PROCESSING |
|---|---|---|
| CHEMICAL LIQUID PROCESSING VESSEL P1 | 1 | CLEANING |
| WATER RINSE PROCESSING VESSEL R1 | 2 | WATER RINSE |
| CHEMICAL LIQUID PROCESSING VESSEL P2 | 1 | CLEANING |
| WATER RINSE PROCESSING VESSEL R2 | 2 | WATER RINSE |
| CHEMICAL LIQUID PROCESSING VESSEL P3 | 1 | CLEANING |
| WATER RINSE PROCESSING VESSEL R3 | 2 | WATER RINSE |
| DRYING UNIT | 3 | DRYING |

FIG.5

PROCESSING SYSTEM AND PROCESSING METHOD

CROSS REFERENCE TO RELATED APPLICATIONS

The subject application is related to subject matter disclosed in Japanese Patent Application No. 2002-1206 filed on Jan. 8, 2002 to which the subject application claims priority under Paris Convention and which are incorporated herein by reference.

BACKGROUND OF THE INVENTION

1. Field of the Invention

The present invention relates to a processing system and a processing method for processing objects to be processed, e.g., semiconductor wafers, etc.

2. Description of the Prior Art

For example, in fabrication processes for semiconductor devices, processing systems for performing processing of cleaning, removing resist films etc. on the surfaces of semiconductor wafers (hereinafter called "wafers") are used. As one example of such processing systems is known a processing system in which processing liquids for processing wafers are kept in processing tanks, and wafers are immersed in the processing liquids. In this processing system, a carrier is moved along a group of one processing tank or more processing tanks, and respective rots of a plurality of wafers are immersed in the processing vessel of the processing vessel group to be processed. The processing vessels arranged in the processing vessel group are chemical liquid vessels respectively containing a plurality of kinds of chemical liquids for cleaning processing, rinse vessels for containing pure water for rinse, or processing vessels for containing a plurality of kinds of processing liquids, etc.

However, in the conventional processing system, when processing vessels which can make the same processing are disposed in a plurality of processing vessel groups, an operator selects a processing vessel group in which one processing vessel to be used is disposed, and prepares a processing recipe. For example, when wafers are continuously loaded into the processing unit for processing, processing vessel groups and processing vessels are selected for the respective rots every time the wafers are loaded. Such recipe preparation by operators is bothering, which very possibly causes judgement delay and mistakes. This is a cause for lowering throughputs. Specifically, a misjudgement that one of a plurality of the same processing vessels is frequently selected, and said one processing vessel is excessively used. A misjudgement that a processing vessel in which a preceding rot is being processed is selected, and a following rot is loaded in the processing vessel before the processing is not completed. This often causes the processing to be again redone or causes an interruption of the processing in the processing system.

SUMMARY OF THE INVENTION

An object of the present invention is to provide a substrate processing system and a substrate processing method which can simplify the preparation of processing recipes by operators and also can provide high throughputs.

To solve the above-described problem, the present invention provides a processing system for processing at least one object group consisting of at least one object-to-be-processed in a processing vessel with a processing liquid, comprising a plurality of processing vessel groups, which can perform the same processing, each consisting of at least one processing vessel; transportation apparatus for transporting object groups to the plurality of processing vessel groups; and a control unit for selecting the processing vessel groups for the object groups to be transported to, the control unit having an applying function of applying processing recipes to the respective object groups and a selecting function of selecting the processing vessel groups for executing the respective applied processing recipes in a prescribed sequence. In this processing system, when a plurality of object groups are processed, the preparation of processing recipes and the selection of the processing vessel groups by operators can be easy. The objects-to-be-processed are, e.g., substrates, such as wafers, etc. The object groups are substrate groups, as of wafers groups, etc., each consisting of, e.g., at least one wafer to be processed in rots in the respective processing vessel groups.

It is preferable that the plurality of processing vessel groups respectively include processing vessels which can process the object groups with the same processing liquids.

It is possible that the control unit has a storing function of storing the processing recipes. It is possible that the control unit has a judging function of judging whether or not the respective processing vessel group are usable. It is preferable that the control unit selects the processing vessel groups except a processing vessel group the control unit has judged unusable.

It is possible that at least one supply pipe for supplying the processing liquid is provided for the processing vessels. It is possible that a plurality of supply pipes for supplying different kinds of processing liquids to one of the processing vessels.

The control unit can control the processing of the respective processing vessel groups so that the processing liquids in the processing vessels of the processing vessel groups can be concurrently replaced.

The present invention provides a processing system for processing at least one object group consisting of at least one object-to-be-processed in a processing vessel with a processing liquid, comprising an input unit for an operator to input processing recipes in; a plurality of processing vessel groups, which can perform the same processing, each consisting of at least one processing vessel; transportation apparatus for transporting object groups to the plurality of processing vessel groups; and a control unit which when the processing recipes inputted by the input unit are the same for the plurality of processing vessel groups, selects the processing vessel groups for executing the same processing recipe in a prescribed sequence and control the transportation apparatus to transport the respective object groups to the processing vessel groups selected in the prescribed sequence.

It is preferable that the plurality of processing vessel groups respectively include processing vessels which can process the object groups with the same processing liquids.

It is possible that the control unit has a storing function of storing the processing recipes. It is possible that the control unit has a judging function of judging whether or not the respective processing vessel group are usable. It is preferable that the control unit selects the processing vessel groups except a processing vessel group the control unit has judged unusable.

The control unit can control the processing of the respective processing vessel groups so that the processing liquids in the processing vessels of the processing vessel groups can be concurrently replaced.

The present invention provides a processing method for transporting at least one object group consisting of at least one object-to-be-processed to a plurality of processing vessel groups, each consisting of at least one processing vessel, to process the object group in the processing vessels with a processing liquid, comprising selecting sequentially different ones out of a plurality of the processing vessel groups for processing object groups in a prescribed sequence and processing the object groups in the selected processing vessel groups in accordance with prescribed processing recipes. In this processing method, the preparation of processing recipes by operators is easy, and decrease of throughputs due to misjudgments can be precluded.

It is possible that the plurality of processing vessel groups respectively include processing vessel groups for processing the object groups in accordance with the same processing recipe. It is preferable that the plurality of object groups are processed in parallel. In this case, high throughputs can be obtained. It is preferable that the processing vessel groups except processing vessels which have been judged unusable are selected.

It is possible that the processing of the respective processing vessel groups is controlled so that the processing liquids in the processing vessels of the processing vessel groups can be replaced concurrently.

BRIEF DESCRIPTION OF THE DRAWINGS

FIG. 4 is the table of an initial state displayed on the input/output means.

FIG. 5 is a displayed table of a sequence inputted by an operator.

DESCRIPTION OF PREFERRED EMBODIMENTS

Figure 1:
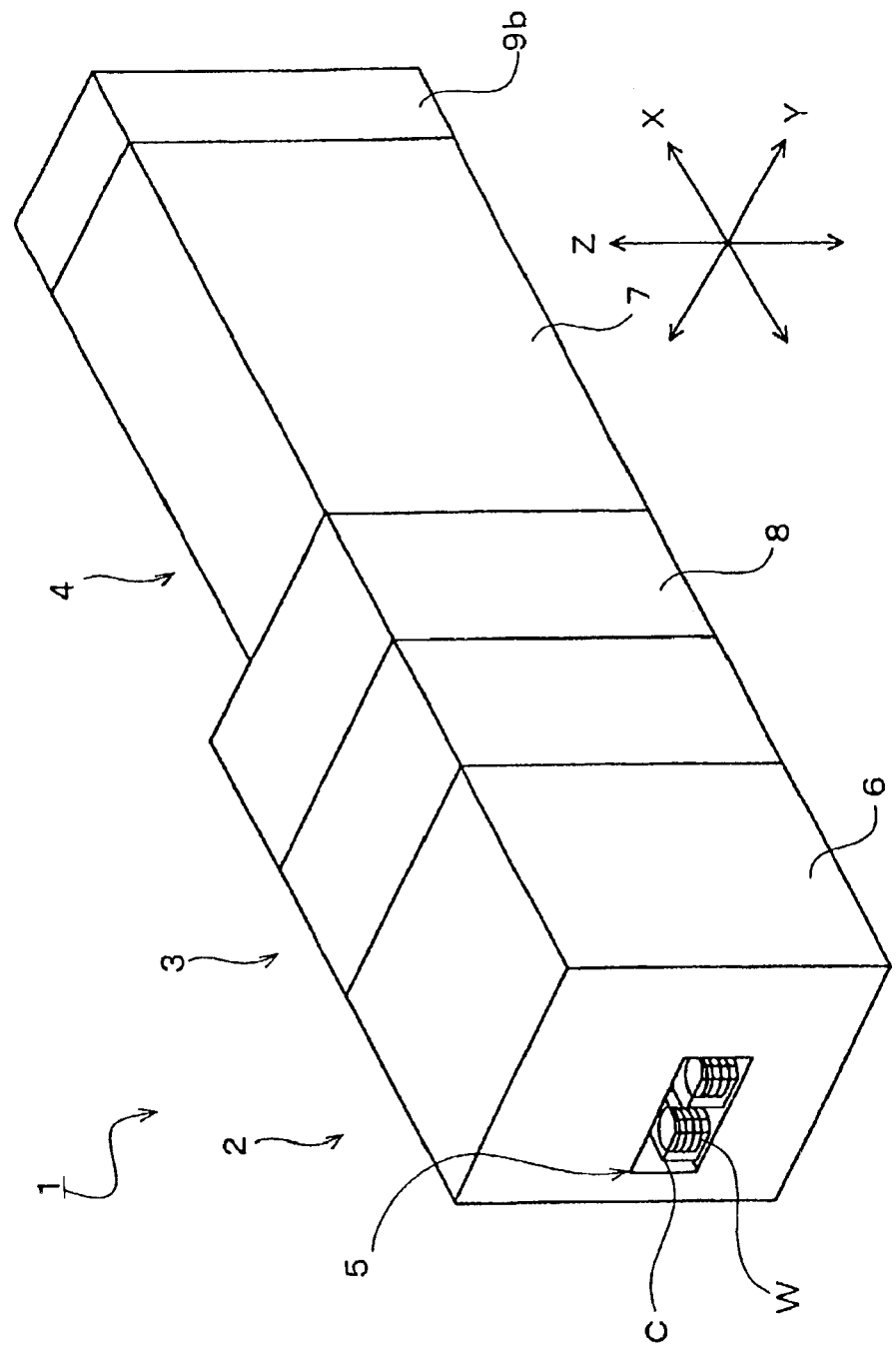
FIG. 1 is a perspective view of the processing system.
Figure 2:
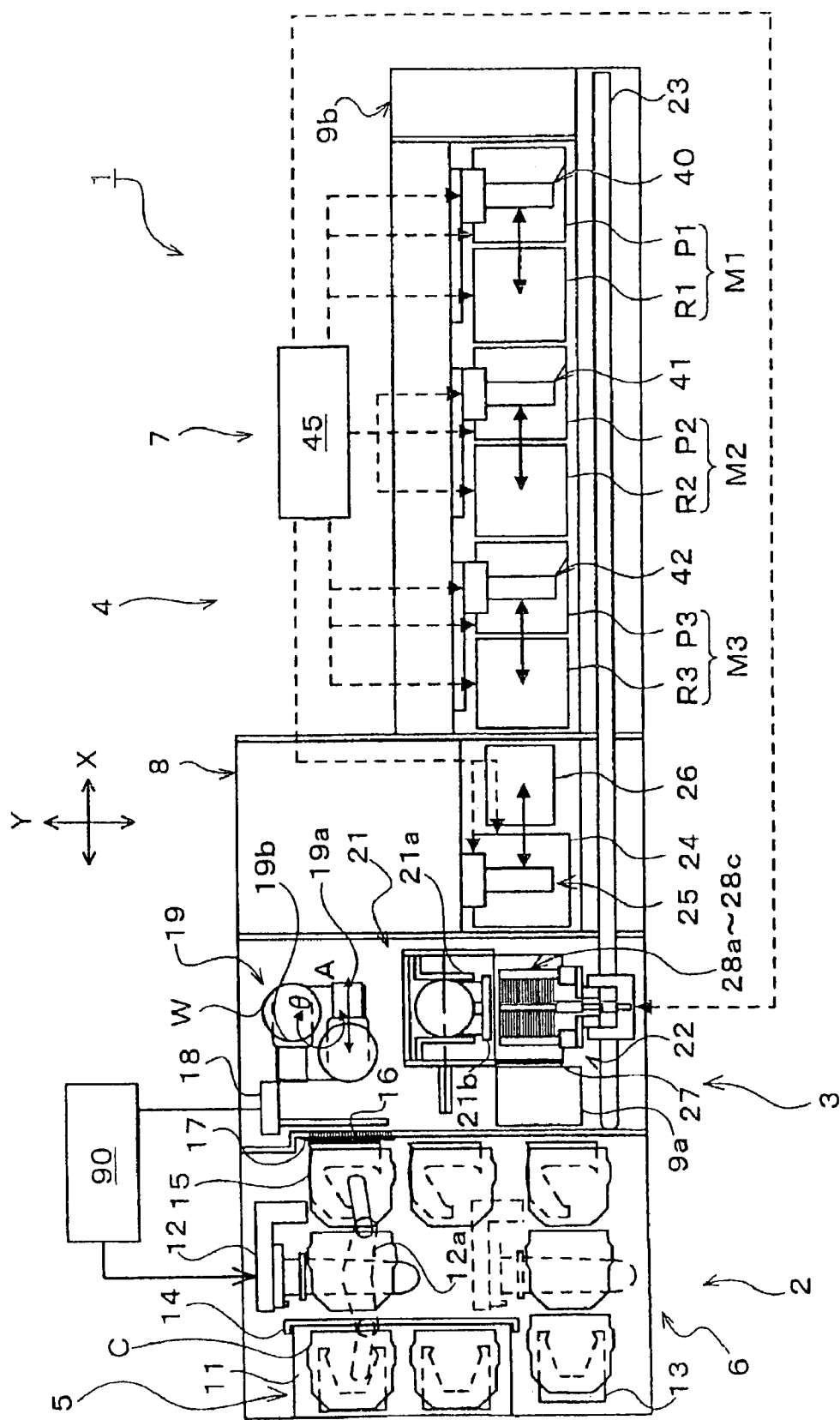
FIG. 2 is a plan view of the processing system.

A preferred embodiment of the present invention will be explained by means of chemical liquid vessels as processing vessels for cleaning processing wafers as one example of substrates. FIG. 1 is a perspective view of the processing system 1 according to the present embodiment, having a chemical liquid processing vessel P3 incorporated. FIG. 2 is a plan view of the chemical liquid processing vessel. As shown in FIGS. 1 and 2, the processing system 1 mainly comprises a load in/out unit 2 which loads in and out carriers C for carrying wafers W, holding the wafers W horizontally and also storing the wafers, a liquid processing unit 4 which performs liquid processing with a prescribed chemical liquid, drying processing, etc. on the wafers, and an interface unit 3 which carries the wafers W between the loading in/out unit 2 and the liquid processing unit 4.

The load in/out unit 2 comprises a carrier load in/out unit 5 having a stage 11 formed in on which carriers C each holding a prescribed number of wafers W, e.g., 25 wafers W substantially horizontally and having a load in/out opening for the wafers W in one side, which can be opened and closed by a lid, and a carrier stock 6 which has a prescribed number of carrier holding members 13 for holding the carriers C and can store a plurality of carriers C. The carriers C mounted on the stage 11, holding wafers W to be processed are transported to the carrier stock unit 6 by the carrier transport means (transportation apparatus) 12, and the carriers C holding the liquid processed wafers W are transported from the carrier stock unit 6 to the stage 11 by the carrier transport means 12.

A shutter 14 is provided between the carrier load in/out unit 5 and the carrier stock 6. The shutter 14 is opened when the carriers C are transferred between the carrier load in/out unit 5 and the carrier stock 6 but is normally closed so as to atmospherically separate the carrier load in/out unit 5 from the carrier stock unit 6.

The carrier transport means 12 has an arm 12a in the form of a multi-articulated arm, an extensible arm or others, which are driven so as to move at least the carrier C in the X-direction, and such carrier arm 12a holds and transports the carrier. The carrier transport means 12 can be driven also in the Y-direction and the Z-direction (height-wise) by a Y axial drive mechanism and a Z axial drive mechanism not shown, so that the carriers C can be mounted on the carrier holding members 13 disposed at prescribed positions.

The carrier holding members 13 are disposed near a wall defining a carrier stock 6 in FIG. 2 and are arranged height-wise in a plurality of stages, e.g., 4 stages at respective positions. The carrier stock 6 has the roles of temporarily storing the carriers C holding wafers W to be liquid processed or storing the empty carriers from which wafers W have been removed.

A window 16 is provided at the border between the carrier stock 6 and the interface unit 3. On the side of the window 16 opposed to the carrier stock 6, detection/load in/out stages 15 of the same structure as the carrier holding members 13 are disposed in such a manner that the lids of the carriers C can be opposed to the window 16. Without disposing the detection/load in/out stages 15, the carrier transport means 12 may hold the carrier C for a prescribed period of time at a prescribed interval opposed to the window 16.

On the side of the window 16 opposed to the carrier stock 6, a lid opening/closing mechanism 17 for opening/closing the lid of the carrier C is mounted on the detection/load in/out stage 15, so that with the window 16 and the lid of the carrier C opened, the wafers W in the carrier C can be unloaded out of the carrier C to the interface unit 3, and oppositely wafers W can be loaded into the carrier C from the interface unit 3. The lid opening/closing mechanism 17 may be disposed on the side of the window opposed to the interface unit 3.

Wafer detection means 18 for counting a number of wafers W in the carrier C is disposed on the side of the window 16 opposed to the interface unit 3. The wafer detection means 18 scans an infrared sensor head having an emitting unit and a detecting unit over the X-directional ends of wafers W held in the carrier C in the Z-direction, detecting signals of transmitted rays or reflected rays of the infrared rays between the emitting unit and the detecting unit to thereby detect a number of the wafers W. Preferably, the wafer detection mechanism 18 has the function of detecting states of held wafers W, e.g., whether or not the wafers W are respectively held horizontally at a prescribed pitch in the carrier C, whether or not the wafers W are tilted, held on different levels, or others while detecting a number of the wafers W. The infrared sensor may be used to detect a number of wafers W after states of holding the wafers W have been detected.

The wafer detection means which detects only a number of wafers W is used in, e.g., a case that empirically wafers W are seldom held on different levels in the carriers C. The wafer detection means which detects only states of holding wafers W may be used in, e.g., a case that empirically excessive or short numbers of wafers W held in the carriers C take place only extremely few times.

The operation of the carrier transport means 12 and the wafer detection means 18 are controlled by a carrier transport means control unit 90. The carrier transport means control unit 90 controls the carrier transport means 12 to store the carrier C in the carrier stock 6 after a numbers of wafers W in the carrier C has been detected by the wafer detection means 18. The opening/closing of the shutter 14, the opening/closing of the window 16 and the operation of the lid opening/closing mechanism 17 are controlled by the carrier transport means control unit 90, interlocked with a motion of the carrier transport means 12.

In the interface unit 3 there are disposed wafer load in/out means 19, wafer transfer means (apparatus) 21 and wafer transport means (apparatus) 22. The wafer transfer means 21 transfers wafers W to and from the wafer load in/out means 19 and includes a posture changing mechanism 21a which changes a posture of the wafers W and a wafer vertically holding mechanism 21b which transfers the wafers W between the posture changing mechanism 21a and the wafer transport means 22.

The wafer load in/out means 19 unloads wafers W in the carrier C to the posture changing mechanism 21a through the window 16 and receives liquid-processed wafers W from the posture changing mechanism 21a to load the liquid-processed wafers W into the carrier C. The wafer load in/out means 19 has two units of arms, arms 19a which carry wafers to be processed and arms 19b which carry liquid-processed wafers W. In order to hold at once a plurality of wafers W held in the carrier C, prescribed numbers of the arms 19a, 19b are arranged in agreement with a prescribed pitch of the wafers W held in the carrier C in the Z-direction at the prescribed pitch. In the state shown in FIG. 2, the arms 19a, 19b a removable (slidable) or extensible in the direction indicated by the arrow A and is movable up and down over a prescribed distance in the Z-direction. Furthermore, the wafer load in/out means 19 is rotatable as a whole in the θ direction so as to be accessible to both the carrier C mounted on the detection/load in/out stage 15 and the posture changing mechanism 21a.

The drive mode of the wafer load in/out means 19 is exemplified as follows. First, the arms 19a are on the side of wafer transfer means 21 with the arrowed A direction in agreement with the X-direction. The arms 19a are moved (slided) or extended below the undersides of wafers W and lifted over a prescribed distance to hold the wafers W. Then, the arms 19a are moved (slided) in the opposite direction or withdrawn to unload the wafers W from the carrier C. Then, the wafer load in/out means 19 is rotated as a whole by 90° counter-clockwise in FIG. 2 to bring the arrowed direction A into agreement with the Y-direction and position the arms 19a on the side of the liquid processing unit 4. In this state, the arms 19a are moved (slided), or extended or withdrawn to thereby transfer the wafers W held by the arms 19a to the posture changing mechanism 21.

On the other hand, with the arrowed direction A in agreement with the Y-direction and with the arms 19b positioned on the side of the liquid-processing unit 4, the arms 19b are moved (slided), or extended or withdrawn to unload liquid-processed wafers W from the posture changing mechanism 21a, and then the wafer load in/out means 19 is rotated as a whole by 90° clock-wise in FIG. 2 to bring the arrowed direction A into agreement with the X-direction and position the arms 19b on the side of the wafer transfer means 21. In this state the arms 19b are moved (slided), or extended or withdrawn to thereby load the wafers W held by the arms 19b into the carrier C.

Wafers W are held substantially horizontally to be transported by the wafer load in/out means 19. However, the wafers W have to be cleaned, substantially held vertically, and to this end, the wafers W must have the posture changed by the posture changing mechanism 21a. The posture changing mechanism 21a includes a guide member, etc. having grooves or others for holding wafers W at a pitch which agrees with a pitch of arranging the wafers W in, e.g., the wafer load in/out means 19. The guide member, etc. are rotated by about 90° in the prescribed direction to thereby change the horizontal posture of the wafers W to the vertical posture. The wafers W having the posture thus changed to the vertical posture are transferred temporarily to the wafer vertically holding mechanism 21b before transferred to the wafer transport means 22.

The wafer vertically holding mechanism 21b has grooves formed at a pitch which is half a pitch for holding wafers W in the carriers C and can hold totally 50 wafers W held in two carriers C. A wafer group WS of totally 50 wafers W is formed, and wafers W which have been held in 2 carriers C can be simultaneously liquid-processed. The wafer vertically holding mechanism 21b is slidable between a position where wafers W can be transferred to and from the posture changing mechanism 21a and a position where wafers W can be transferred to and from chucks 28a–28c of the wafer transport means 22, and does not impinge on the chucks 28a–28c of the wafer transport means 22 when the wafer vertically holding mechanism 21b is slided to the side of the wafer transport means 22.

A pitch of wafer transfer means 21 for holding wafers W is adjusted as follows, for example. First, 25 wafers W are transferred from a first carrier C to the posture changing mechanism 21a by the wafer load in/out means 19. Then, the posture changing mechanism 21a changes the posture of the wafers W to the substantially vertical posture and transfers the wafers W to the wafer vertically holding mechanism 21b. At this time, the pitches of the wafers transferred to and held in the wafer vertically holding mechanism 21b are the same as that of the arrangement of the wafers in the carrier C. Subsequently, 25 wafers W in a second carrier C are transferred to the posture changing mechanism 21a by the wafer load in/out means 19. Then, the posture changing mechanism 21a changes the posture of the wafers W to substantially vertical posture and transfers the wafers to the wafer vertically holding mechanism 21b. At this time, the wafer vertically holding mechanism 21b is offset in the direction of arrangement of the wafers W by a distance of a half of the pitch at which the wafers W are arranged, whereby the wafers W can be held in the wafer vertically holding mechanism 21b at a pitch which is half the pitch of the wafers in the carriers C. Thus, the wafer vertically holding mechanism 21b can hold the wafers W held in two carriers C at an arrangement pitch which is half the arrangement pitch in the carriers C and can hold the totally 50 wafers W as a wafer group WS.

The wafer transfer means 22 transfers a wafer group WS to and from the wafer vertically holding mechanism 21b to load the wafer group WS of the wafers W to be processed into the liquid processing unit 4 and oppositely to unload a wafer group of wafers W which have been subjected to liquid processing or others out of the liquid processing unit 4 and transfer the wafer group WS to the wafer vertically holding mechanism 21b. In the wafer transport means 22, a wafer group WS is held by the three chucks 28a–28c.

In order for the wafer transport means 22 to transfer a wafer group WS to and from the wafer vertically holding mechanism 21b and transport the wafer group WS to the liquid processing unit 4, the wafer transport means 22 is movable along a guide rail 23 in the X-direction to go into/out of the liquid processing unit 4. A detection sensor for detecting an arrangement state of the wafers W of a wafer group WS is disposed at a position where the wafer group WS is transferred between the wafer vertically holding mechanism 21b and the wafer transport means 22 so as to confirm whether or not the wafers W of the liquid-processed wafer group WS have damages or dislocations. The detection sensor 27 is not essentially disposed at this position and can be disposed at any position where the detection can be made on the wafers of a wafer group WS by the time when the wafer group WS which has been liquid-processed is transported to the wafer load in/out means 19.

In the interface unit 3, a parking area 9a is provided beside the place where a wafer group WS is transferred between the wafer vertically holding mechanism 21b and the wafer transport means 22. In the parking area 9a, a wafer group WS to be liquid-processed, for example, can stand by. For example, while liquid-processing or drying processing is going on one wafer group WS, the wafer transport means 22 is used to transport a wafer group WS to be processed next to the parking area 9a. Thus, a period of time of transporting a wafer group WS from the parking area 9a to the liquid processing apparatus 7 can be shorter in comparison with a period of time of transporting a wafer group WS from the carrier stock 6 to the liquid processing apparatus 7. This increases throughputs.

The liquid processing unit 4 comprises the liquid processing apparatus 7, a drying unit 8 and a parking area 9b. The drying unit 8, the liquid processing apparatus 7 and the parking area 9b are arranged in the stated order from the side nearer to the interface unit 3. The wafer transport means 22 can be moved in the liquid processing unit along a guide rail 23 extended in the X-direction.

In the parking area 9b as well as the parking area 9a, a wafer group WS to be processed stand by. While liquid-processing or drying processing is going on one wafer group WS, the wafer transport means 22 is used to transport a wafer group WS to be processed next to the parking area 9b. The parking area 9b is near the liquid processing apparatus 7, which can shorten a period of time of transporting the wafer group WS when liquid processing is started, and throughputs can be accordingly increased.

In the liquid processing apparatus 7, as shown in FIG. 2, the first processing vessel group M1, the second processing vessel group M2 and the third processing vessel group M3 are arranged in the stated order from the side nearer to the parking area 9b. The first processing vessel group M1, the second processing vessel group M2 and the third processing vessel group M3 each include a chemical liquid vessel for cleaning wafers W with a chemical liquid and a water rinse vessel for rinsing wafers W with pure water (DIW). The first processing vessel group M1 includes the first chemical liquid vessel P1 and the first water rinse vessel R1. There is provided a first intra-processing vessel group transport means 40 for transporting wafer groups WS between the first chemical liquid vessel P1 and the first water rinse vessel R1. The second processing vessel group M2 includes the second chemical liquid vessel P2 and the second water rinse vessel R2. There is provided the second intra-chemical processing vessel transport means 41 for transporting wafer groups WS between the second processing vessel group P2 and the second water rinse vessel R2. The third processing vessel group M3 includes the third chemical liquid vessel P3 and the third water rinse vessel R3. There is provided a third intra-processing vessel group transport means 42 for transporting wafer groups WS between the third chemical liquid vessel P3 and the third water rinse vessel R3. As described above, the processing vessel groups M1, M2, M3 each include two different kinds of processing vessels, i.e., a chemical liquid vessel and a water rinse vessel, and the same combination of the chemical liquid vessel and the water rinse vessel.

The first chemical liquid vessel P1, the second chemical liquid vessel P2 and the third chemical liquid vessel P3 contain a chemical liquid for cleaning wafers W, e.g., SC-1 (a mixed solution of ammonium, hydrogen peroxide and water) or others for removing adhering objects, e.g., particles, etc. The first water rinse vessel R1, the second water rinse vessel R2 and the third water rinse vessel R3 contain DIW (pure water) for water rinsing the wafers W. The first to the third water rinse vessels R1, R2, R3 are for removing a chemical liquid staying on the wafers W through the chemical liquid processing in the first to the third chemical liquid vessels P1, P2, P3 and use various water rinse methods, e.g., overflowing, quick dumpling, etc. As described above, the first processing vessel group M1, the second processing vessel group M2 and the third processing vessel group M3 each comprise the chemical liquid vessel and the water rinse vessel. In the respective processing vessel groups, the same processing is made on wafers W. That is, cleaning processing with a chemical liquid and water rinse following the cleaning processing are made. A chemical liquid contained in the chemical liquid vessels P1, P2, P3 is not essentially SC-1 liquid, and the chemical liquid vessels P1, P2, P3 may contain other chemical liquids for making the cleaning processing on wafers W.

The first intra-processing vessel transport means 40 has a drive mechanism which can be moved up and down in the Z-direction, and lowers a wafer group WS transferred from the wafer transport means 22 to immerse the wafer group WS for a prescribed period of time and lifts the wafer group WS, and then moves the wafer group WS in parallel in the X-direction to immerse the wafer group WS in the first water rinse vessel R1 for a prescribed period of time and lifts the wafer group WS. The wafer group WS which has been processed in the first water cleaning vessel R1 is returned to the chucks 28a–28c of the wafer transport means 22 to be transported to the drying unit 8 by the wafer transport means 22. The second and the third intra-processing vessel group transport means 41, 42 have the same constitution as the first intra-processing vessel group transport means 40 and is operated as is the first intra-processing vessel. As described above, the wafer transport means 22 transports wafer groups M1, M2, M3 and transfers the wafer groups WS to the intra-processing vessel group transport means 40, 41, 42 to load the wafer groups WS. The first to the third intra-processing vessel group transport means 40, 41, 41 transport the wafer groups WS in the respective processing vessel groups M1, M2, M3. The wafer transport means 22 receives wafer groups WS from the intra-processing vessel group transport means 40, 41, 42 to unload the wafer groups WS.

Preferably, the transfer of wafer groups WS between the wafer transport means 22 and the first to the third intra-processing vessel group transport means 40, 41, 42 is performed respectively over the first to the third water rinse vessels R1, R2, R3. This is for the prevention of contaminating wafer groups WS from being contaminated with or damaged by vapor of chemical liquids, etc. when the wafer transport means 22 is stopped over the first to the third chemical liquid vessels P1, P2, P3.

Figure 3:
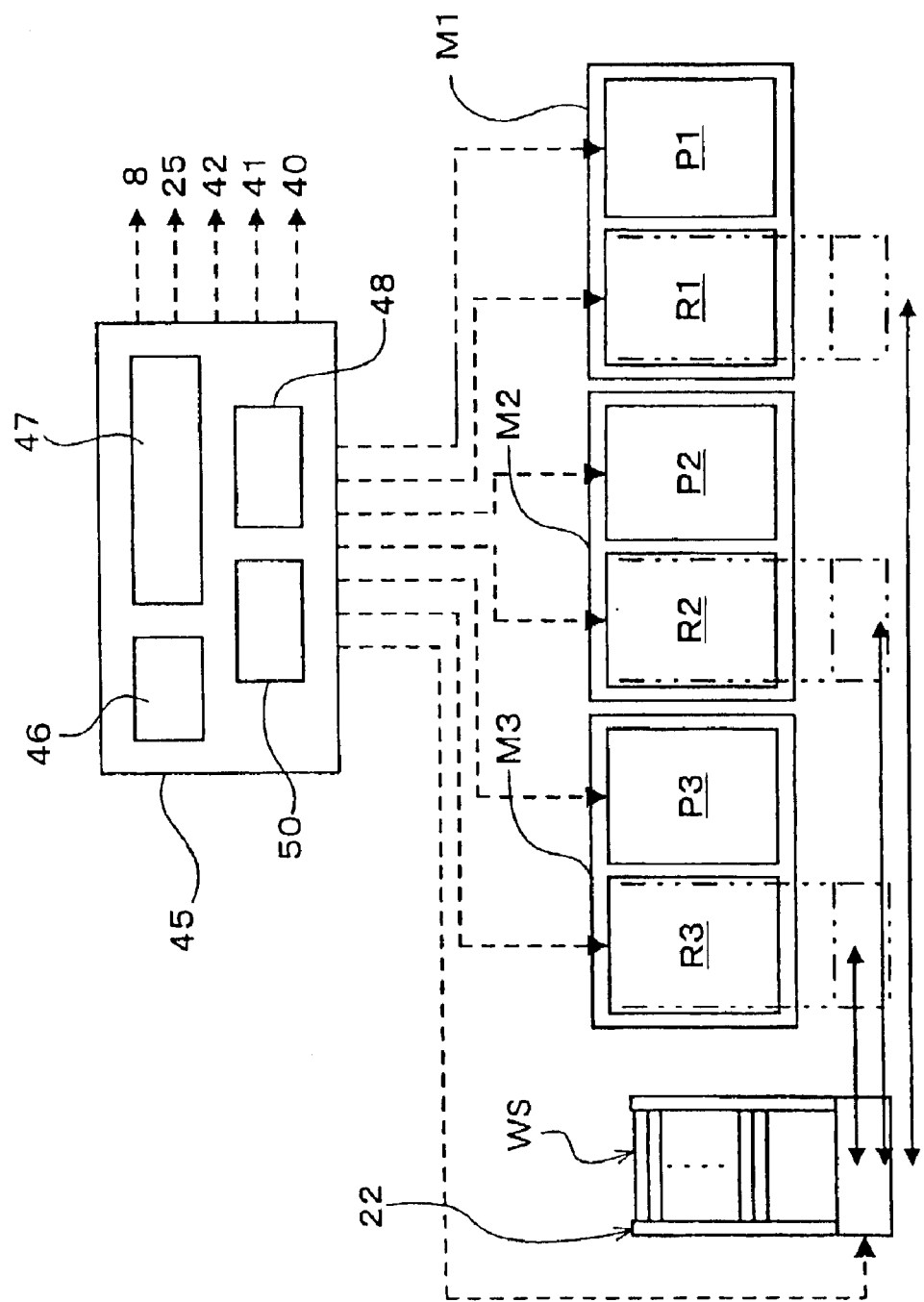
FIG. 3 is a view explaining the processing vessel groups and the control unit.

The processing of wafer groups WS in the first processing vessel group M1, the second processing vessel group M2 and the third processing vessel group M3 is controlled by a control unit 45 which selects the processing vessel groups M1, M2, M3 for the wafer transport means 22 to transport wafer groups WS to. As shown in FIG. 3, output signals (control signals) of the control unit 45 are supplied to the wafer transport means 22, the intra-processing vessel group transport means 40, 41, 42, the chemical liquid vessels P1, P2, P3 and the water rinse vessels R1, R2, R3. The control unit 45 comprises a computer 47 which selects the processing vessel groups M1, M2, M3 which will execute processing recipes of respective wafer groups WS, a memory unit 48 having the function of storing processing recipes, a controller 50 which interprets the processing recipes to supply suitable commands to respective parts of the processing system, and an input/output unit 46 which is interconnected with these devices to supply inputs from an operator and output supplied data to the operator. The input/output unit 46, the computer 47, the memory unit 48 and the controller 50 are interconnected with one another by a connection circuit not shown, and can mutually supply and receive signals.

The operator who controls processing of wafer groups WS in the liquid processing unit 4 knows processing recipes to be made on the respective wafer groups WS. For example, processing recipes the operator knows are cleaning processing to be first made with a chemical liquid, e.g., SC-1 liquid or others, water rinse processing to be second made and drying processing to be third made. The operator knows that the cleaning processing can be performed in any one of the chemical liquid vessels P1, P2, P3 and rinsing processing can be performed in any one of the water rinse vessels R1, R2, R3, and the drying processing can be performed in the drying unit 8. A chemical liquid used in the cleaning processing of wafer groups WS is not limited to SC-1 liquid.

The input/output unit 46 displays on a monitor or others names of processing steps of processing wafer groups WS to the operator controlling the processing of the wafer groups WS in the liquid processing unit 4. The table as exemplified in FIG. 4 is displayed. The table contains a column of the names of the processing vessels for executing the processing steps, a column of a sequence of the processing steps to be executed on the wafer groups WS, and a column of the names of the processing steps which can be executed by the processing system 1. In the example as shown in FIG. 5, the names of the chemical liquid vessels P1, P2, P3, the water rinse vessels R1, R2, R3 and the drying unit 8 incorporated in the processing system 1 are displayed in the column of the names of the processing vessels, a sequence (1) of executing the cleaning processing, a sequence (2) of executing the water rinse processing and a sequence (3) of executing the drying processing are displayed in the column of a sequence, and the cleaning processing step to be executed in the respective chemical liquid vessels P1, P2, P3, the water rinse processing step to be executed in the respective water rinse vessels R1, R2, R3 and the names of the drying processing step to be executed in the drying unit 8 are displayed in the column of the names of the processing steps. As described above, the respective chemical liquid vessels P1, P2, P3, the water rinse vessels R1, R2, R3, the name of the drying unit 8, a sequence of executing the cleaning processing, water rinse processing and drying processing, and the names of the cleaning processing step, the water rinse processing step and the drying processing step are displayed in a form readily understandable to the operator. The table shown in FIG. 4 is displayed in the initial state.

The input/output unit 46 displays to the operator on the monitor or others the names of the respective chemical liquid vessels P1, P2, P3 which are to execute the cleaning processing of wafer groups WS, the respective water rinse vessels R1, R2, R3 which are to execute the water rinse processing and the drying unit 8 which is to execute the drying processing, a set sequence of the respective cleaning processing, the respective water rinse processing and the respective drying processing, and the names of the respective cleaning processing, the respective water rinse processing and the respective drying processing. For example, the table as exemplified in FIG. 4 is displayed. That is, the table contains the column of the names of the respective chemical liquid vessels P1, P2, P3, the respective water rinse vessels R1, R2, R3 and the drying unit 8 incorporated in the processing system 1, the column of a sequence of executing the respective cleaning processing, the respective water rinse processing and the respective drying processing, and the column of the names of the respective cleaning processing step, the respective water rinse processing step and the respective drying processing step. As described above, the names of the respective chemical liquid vessels P1, P2, P3, the respective water rinse vessels R1, R2, R3 and the drying unit 8, a sequence of executing the respective cleaning processing, the respective water rinse processing, the respective drying processing, and the names of the respective cleaning processing, the respective water rinse processing and the respective drying processing are displayed in a form which is readily understandable to the operator.

The input/output unit 46 functions as an input unit for the operator to input to the controller 45 a sequence of the respective chemical liquid vessels P1, P2, P3, the respective water rinse vessels R1, R2, R3 and the drying unit. The operator can input a sequence of executing the respective cleaning processing, the respective water rinse processing and the respective drying processing by means of a monitor of the touch-panel type or others. For example, the operator can use the input/output unit 46 to input a sequence in the column of the table of FIG. 4 displayed on the monitor showing a sequence of executing the respective cleaning processing, the respective water rinse processing and the respective drying processing, or can change a sequence inputted in the sequence column. For example, the sequence displayed in the sequence column of the table in the initial state shown in FIG. 4 is changed to the sequence of FIG. 5, in which the number 1 is inputted in the sequence column in the row of the first processing, the cleaning processing, the number 2 in the sequence column in the row of the second processing, the water rinse processing, the number 3 in the sequence column in the row of the third processing, the drying processing. The operator knows the sequence of the respective cleaning processing, the water rinse processing and the drying processing and can easily input sequences of the respective cleaning processing, the respective water rinse processing and the respective drying processing. Thus, the number 1, the number 2 and the number 3 are simultaneously thus inputted respectively for the respective chemical liquid vessels P1, P2, P3 for the cleaning processing, for the water rinse vessels R1, R2, R3 for the water rinse processing and for the drying unit 8 for the drying processing. Then, the same number is set for the processing vessels for executing the same processing.

The input/output unit 46 functions as an input unit for the operator to input processing recipes for respective processing vessel groups WS. When the operator loads wafer groups WS to be processed, he inputs processing recipes for processing the wafer groups WS. When the number 1, the number 2 and the number 3 are applied respectively to the cleaning processing, the water rinse processing and the drying processing, a processing recipe RE0 in which the cleaning processing is first performed, the water rinse processing is second performed, and the drying processing is third performed is prepared. When respective wafer groups WS are processed in accordance with the same recipe, the operator inputs to the input/output unit 46 a command that the respective wafer groups WS which are continuously loaded be proceed in accordance with the same recipe.

The computer 47 operates based on processing recipes inputted by the operator through the input/output unit 46, and programs and others which have been stored in advance, and applies the processing recipes to the respective wafer groups WS so that the inputted processing recipes can be executed on the respective wafer groups WS. Furthermore, when a plurality of processing recipes inputted via the input/output unit 46 are the same processing recipe RE0, e.g., the operator inputs to the input-output unit 46 a command that the respective wafer groups WS to be continuously loaded and to be processed in accordance with the same processing recipe or when the operator inputs the processing recipe RE0 for the respective wafer groups WS at the time when the respective processing wafers WS are loaded into the liquid processing unit 4, the computer 47 selects the processing vessel groups for performing the cleaning processing and the water rinse processing of the respective processing recipes RE0 applied to the respective wafer groups WS out of the processing vessel groups M1, M2, M3 in a prescribed sequence. That is, which of the chemical liquid vessels P1, P2, P3 to be used for the cleaning processing is selected, and which of the water rinse vessels R1, R2, R3 to be used for the water rinse processing is selected. Thus, the processing recipes having the chemical liquid vessels for performing the cleaning processing and the water rinse vessels for performing the water rinse processing decided are applied to the respective wafer groups WS. In short, the operator may only command sequences of the cleaning processing, the water rinse processing and the drying processing for the respective wafer groups WS but does not have to select which of the chemical liquid vessels P1, P2, P3 to be used for the cleaning processing and which of the water rinse vessels R1, R2, R3 to be used for the water rinse processing. Accordingly, the preparation of processing recipes by the operator can be simplified.

For example, when the operator inputs the same processing recipe RE0 for first performing the cleaning processing, second performing the water rinse processing and third performing the drying processing for respective wafer groups WS continuously loaded, the computer 47 sequentially applies a processing recipe RE1 for executing the processing recipe RE0 in the processing vessel group M1, a processing recipe RE2 for executing the processing recipe RE0 in the processing vessel group M2 and a processing recipe RE3 for executing the processing recipe RE0 in the processing vessel group M3 to the respective wafer groups WS. That is, the sequence of the processing recipes RE1, RE2, RE3 are repeatedly applied as in the processing recipes RE1, RE2, RE3, RE1, RE2, RE3, . . . . The processing vessel groups M1, M2, M3 for performing the cleaning processing and the water rinse processing of the processing recipe RE0 are thus selected in a prescribed sequence. That is, the chemical liquid vessels P1, P2, P3 for performing the cleaning processing of the processing recipe RE0 are selected in a prescribed sequence, and the water rinse vessels R1, R2, R3 for performing the water rinse processing of the processing recipe RE0 are selected in a prescribed sequence. For example, when the operator inputs to the input/output unit 46 a command that respective wafer groups WS to be continuously loaded and to be processed in accordance with the same processing recipe RE0, the computer 47 sets in advance a processing recipe route [(1) the processing recipe RE1, (2) the processing recipe RE2 and (3) the processing recipe RE3] which are sequentially arranged and repeats the sequence set in the processing recipe route on respective loaded wafer groups WS to sequentially apply the processing recipes RE1, RE2, RE3.

The computer 47 executes the processing recipes applied to respective wafer groups WS. When the processing recipe RE1 is to be executed, the computer 47 controls the chemical liquid vessel P1, the water rinse vessel R1 and the intra-processing vessel group transport means 40 to thereby control the processing of the processing vessel group M1. When the processing recipe RE2 is to be executed, the computer 47 controls the chemical liquid vessel P2, the water rinse vessel R2 and the intra-processing vessel group transport means 41 to thereby control the processing of the processing vessel group M2. When the processing recipe RE3 is to be executed, the computer 47 control the chemical liquid vessel P3, the water rinse vessel R3 and the intra-processing vessel transport means 42 to thereby control the processing of the processing vessel group M3. When the processing recipe RE1 is to be executed, the chemical liquid vessel P1 is first used, the water rinse vessel R1 is second used, and the drying unit 8 is third used. When the processing recipe RE2 is to be executed, the chemical liquid vessel P2 is first used, the water rinse vessel R2 is second used, and the drying unit 8 is third used. When the processing recipe RE3 is executed, the chemical liquid vessel P3 is first used, the water rinse vessel R3 is second used, and the drying unit 8 is third used.

Furthermore, the computer 47 can judge whether or not the processing vessel groups M1, M2, M3 are usable, based on states of the respective chemical liquid vessels P1, P2, P3, the water rinse vessels R1, R2, R3 and the intra-process vessel transport means 40, 41, 41 detected by the monitoring function of the control unit 45 which will be described later. For example, when any one of the chemical liquid vessels P1, the water rinse vessel R1 and the intra-processing vessel transport means 40 is unusable due to a malfunction or others, the computer unit 47 judges that the processing vessel group M1 is unusable. When any one of the chemical liquid vessels P2, the water rinse vessel R2 and the intra-processing vessel transport means 41 is unusable due to a malfunction or others, the computer unit 47 judges that the processing vessel group M2 is unusable. When any one of the chemical liquid vessels P3, the water rinse vessel R3 and the intra-processing vessel transport means 42 is unusable due to a malfunction or others, the computer unit 47 judges that the processing vessel group M3 is unusable. Then, when the computer 47 judges that the processing vessel group M1 is unusable, the computer 47 removes the processing recipe RE1, which is executed in the processing vessel group M1 and applies the processing recipe RE2 and the processing recipe RE3 alternately to respective wafer groups WS. When the computer 47 judges that the processing vessel group M2 is unusable, the computer 47 removes the processing recipe RE2, which is executed in the processing vessel group M2 and applies the processing recipe RE1 and the processing recipe RE3 alternately to respective wafer groups WS. When the computer 47 judges that the processing vessel group M3 is unusable, the computer 47 removes the processing recipe RE3, which is executed in the processing vessel group M3 and applies the processing recipe RE1 and the processing recipe RE2 alternately to respective wafer groups WS.

The memory unit 48 stores programs, etc. for preparing processing recipes and stores in advance commands and data. The memory unit 48 can store the processing recipe RE0 inputted by the operator. When a processing recipe route is set in advance before wafers W are continuously loaded into the liquid processing unit 4, the memory unit 48 can store the set processing recipe route.

The controller 50 reads and interprets the processing recipes RE1, RE2, RE3 applied to respective wafer groups WS, and commands for executing the processing recipes and for controlling the chemical liquid vessels P1, P2, P3, the water rinse vessels R1, R2, R3 and the intra-processing vessel group transport means 40, 41, 41 supplied by the computer 47, and outputs suitable commands to the respective chemical liquid vessels P1, P2, P3, the respective water rinse vessels R1, R2, R3, the respective intra-processing vessel group transport means 40, 41, 42, the wafer transport means 22 and the drying unit 8. The commands of the controller 50 are supplied as control signals to the respective chemical liquid vessels P1, P2, P3, the respective water rinse vessels R1, R2, R3, the respective intra-processing vessel groups transport means 40, 41, 42, the wafer transport means 22 and the drying unit 8. In a case that the processing recipe RE1 is applied to a loaded wafer group WS1, for example, a control signal for transporting the wafer group WS1 to the processing vessel group M1 is supplied to the wafer transport means 22, and supplies a control signal for controlling the processing of the processing vessel group M1 in accordance with the processing recipe RE1 to the intra-processing vessel transport means 40 and the processing vessel group M1. Then, the controller 50 supplies to the wafer transport means 22 a command that the next lot, a wafer group WS2 be loaded and supplies a control signal of transporting the wafer group WS2 to the processing vessel group M2 when the processing recipe RE2 is applied to the wafer group WS2. When a plurality of wafers W are continuously loaded, the controller 50 controls the processing, based on the processing recipes RE1, RE2, RE3 to be performed in parallel. For example, the controller 50 supplies control signals corresponding to the progress of the processing of the wafer group WS1 based on the processing recipe RE1 while the controller 50 supplies control signals corresponding to the progress of the processing of the wafer group WS2 based on the processing recipe RE2 and supplies to the wafer transfer means 22 a control signal for transporting a wafer group WS3 to the processing vessel group M3.

As described above, the control unit 45 has the storing function of storing the processing recipe RE0 to be executed in the respective processing vessel groups M1, M2, M3, the judging function of judging whether the respective processing vessel groups M1, M2, M3 are usable, the applying function of applying the processing recipe RE0 to respective wafer groups WS and the selecting function of selecting the processing vessel groups M1, M2, M3 for executing the processing recipe RE0. The control unit 45 has the function of incessantly monitoring interior states of the respective chemical liquid vessels P1, P2, P3, the respective water rinse vessels R1, R2, R3, the respective intra-processing vessel group transport means 40, 41, 42 and the drying unit 8 so that when the chemical liquid vessels P1, P2, P3, the water rinse vessels R1, R2, R3 and the intra-processing vessel group transport means 40, 41, 42 malfunction, the control unit 45 can automatically detect the malfunctions.

When the processing of wafer groups WS is controlled by the control unit 45, the step of preparing in advance the processing recipes RE1, RE2, RE3 is performed. First, an operator who controls the processing of wafer groups WS in the liquid processing unit 4 inputs in the input/output unit 46 sequences of the respective chemical liquid vessels P1, P2, P3, the respective water rinse vessels R1, R2, R3 and the drying unit 8 to thereby input the processing recipe RE0, and the memory unit 48 stores the processing recipe RE0. Then, when the respective wafer groups WS to be processed are loaded into the liquid processing unit 4, the computer 47 applies the inputted processing recipe RE0 to the respective wafer groups WS and selects the processing vessel groups M1, M2, M3 for executing the processing recipe RE0 applied to the loaded wafer groups WS to be processed. Thus, the computer 47 applies one of the processing recipes RE1, RE2, RE3 to each of the loaded wafer groups WS to be processed. Then, the computer 47 executes the processing recipe RE1; RE2; RE3 applied to each loaded wafer group WS to be processed. When the processing recipes RE1, RE2, RE3 are executed, the controller 50 supplies commands suitable for the respective processing recipes RE1, RE2, RE3 to the respective processing vessel groups M1, M2, M3.

Figure 6:
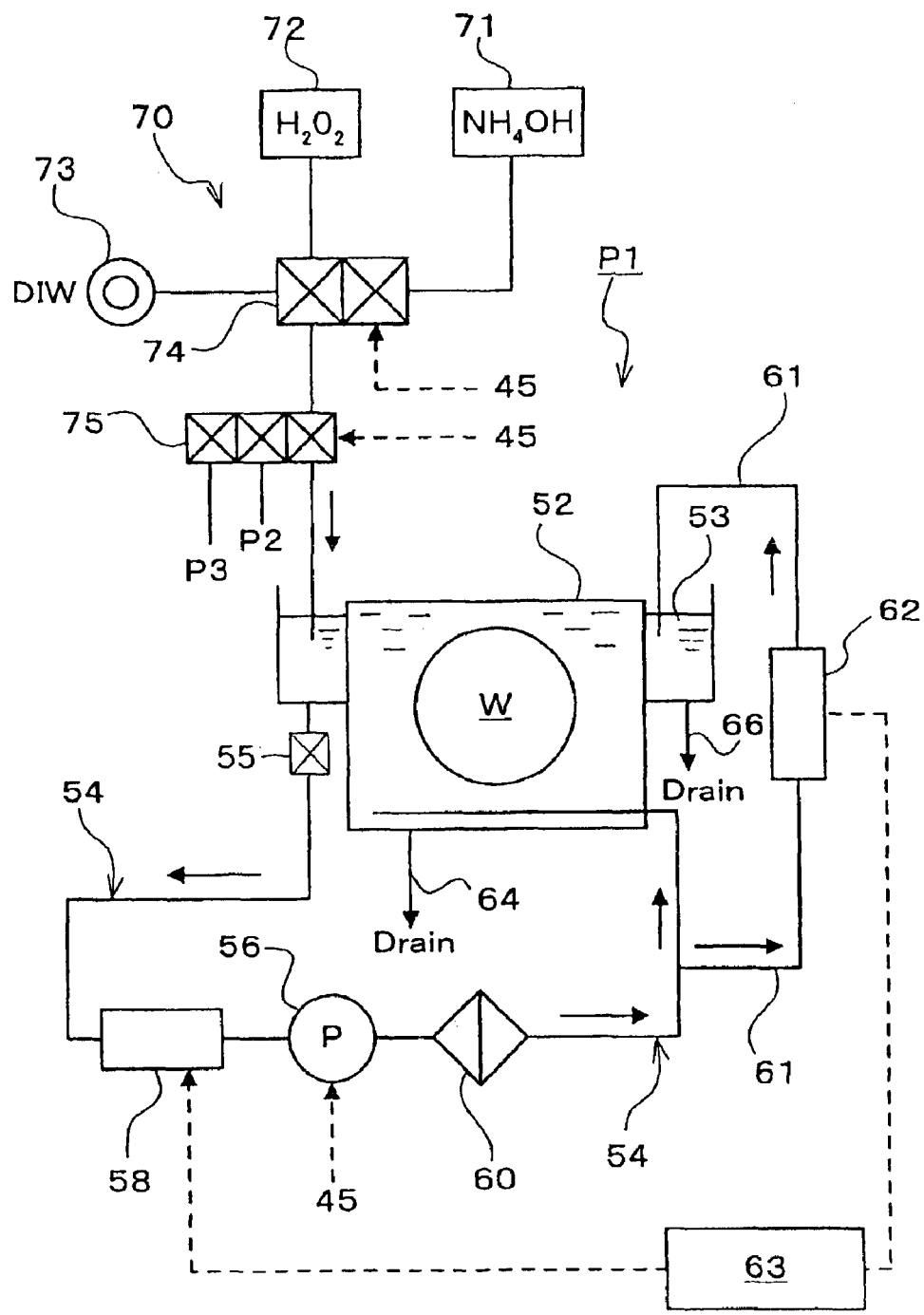
FIG. 6 is a view explaining the chemical liquid vessels and the chemical liquid supply means.

FIG. 6 is a view explaining circuits of the chemical liquid vessels P1, P2, P3 for circulating chemical liquids. The chemical liquid vessels P1, P2, P3 have the same constitution and function, and the explanation of the circuits will be represented by the circuit of the chemical liquid vessel P1. The chemical liquid vessel P1 has a box-shaped inner vessel 53 of a size sufficient to contain a wafer group WS, and an outer vessel 53. The upper side of the inner vessel 52 is opened, and a wafer group WS is loaded into the inner vessel 52 through the opening in the upper side. The outer vessel 53 is provided surrounding the opening of the inner vessel 52 so as to receive a chemical liquid overflowing the upper end of the inner vessel 52. A discharge pipe 64 for discharging the chemical liquid in the inner vessel 52 is provided in the bottom of the inner vessel 52. A discharge pipe 66 for discharging the chemical liquid is provided in the bottom of the outer vessel 53.

A circulatory supply circuit 54 for circulating a chemical liquid during cleaning processing of a wafer group WS is connected between the inner vessel 52 and the outer vessel 53. The circulatory supply circuit 54 has one end connected to the bottom wall of the outer vessel 53 through a valve 55. A temperature controller 58, a pump 56 and a filter 60 are inserted in the circulatory supply circuit 54 in the stated order. The circulatory supply circuit 54 has the other end connected to a nozzle inside the inner vessel 52. Thus, a chemical liquid overflowing the inner vessel 52 into the outer vessel 53 is caused to flow into the circulatory supply circuit 54. The pump 56 is connected as a means for receiving signals from the controller 45. The chemical liquid which has flowed into the circulatory circuit 54 is caused to flow by the operation of the pump 56 to the temperature controller 58 and the filter 60 in the stated order for the temperature adjustment and purification and is again supplied to the inner vessel 52 through the nozzle. The nozzle is disposed at a lower part of the inner vessel 52 and is arranged to supply the chemical liquid to the surfaces of wafers W of a wafer group WS. The controller 45 outputs control signals to the pump 56 to control the circulation of the chemical liquid in the chemical liquid vessel P1.

The temperature controller 58 functions to cool or heat in advance a chemical liquid to be supplied into the inner vessel 52 from the circulatory supply circuit 54 before wafers W are immersed so that a temperature of the chemical liquid in the inner vessel 52 does not become higher or lower that a prescribed processing temperature. The chemical liquid which has been supplied into the inner vessel 52 is circulated through the circulatory circuit 54 to gradually cool or heat the chemical liquid. Thus, a cooled or heated chemical liquid is supplied into the inner vessel 52, whereby the chemical liquid in the inner vessel 52 can be retained at a set temperature. The temperature controller 58 comprises, e.g., a heater, and a heat exchanger and cooling water supply means. A valve inserted in a cooling water supply passage for leading cooling water into the heat exchanger, and the heater are connected to the controller 63. The controller 63 supplies a prescribed control signal as required to the heater or the valve, based on signals supplied from a concentration/temperature detector 62 which will be described later.

The circulatory supply circuit 54 is branched into a branch pipe 61 which flows a chemical liquid in the circulatory supply circuit into the outer vessel 53. The concentration/temperature detector 62 for detecting a temperature and a concentration of a chemical liquid is inserted in the branched pipe 61. The concentration/temperature detector 62 is connected as signal input means to the controller 63. The concentration/temperature detector 62 comprises a thermometer for detecting a temperature of a chemical liquid, and a hydrometer for detecting a concentration of the chemical liquid and supplies a detected temperature and a detected concentration respectively as detected signals to the controller 63. The controller 63 decides a control signal to be supplied to the temperature controller 58, based on the detected signal to maintain a temperature of a chemical liquid in the inner vessel 52.

The chemical liquid supply means 70 which supplies a prescribed concentration of the SC-1 liquid (mixed solution of ammonia, hydrogen peroxide and water) to the chemical liquid vessels P1, P2, P3 comprises an $NH_4OH$ supply tank 71 which is a supply source of $NH_4OH$ (aqueous ammonia), a $H_2O_2$ supply tank 72 which is a supply source of $H_2O_2$ (hydrogen peroxide), a DIW supply source 73 which is a DIW (pure water) source, a mixing valve 74 which mixes $NH_4OH$, $H_2O_2$ and DIW to adjust a prescribed concentration of the SC-1, and a change-over valve 75 which is changed over to supply the adjusted SC-1 liquid to any one of the chemical liquid vessels P1, P2, P3. The mixing valve 74 is connected, as a means for receiving signals, to the control unit 45. In response to control signals from the control unit 45, the mixing valve 74 mixes $NH_4OH$, $H_2O_2$ and DIW to prepare a prescribed concentration of the SC-1. The prepared SC-1 liquid is supplied to the chemical liquid P3 by the change-over valve 75 which has received control signals from the control unit 45. Thus, the control unit 45 outputs control signals to the mixing valve 74 and the change-over valve 75 to thereby supply a prescribed concentration of the chemical liquid to the chemical liquid vessels P1, P2, P3.

The above is the constitution and the function of the chemical liquid vessel P1 of the processing vessel group M1, but the chemical liquid vessels P2, P3 of the rest processing vessel groups of the liquid processing apparatus 7 have the same constitution and function as the chemical liquid vessel P1. Their explanation will not be repeated. The water rinse vessels R1, R2, R3 have the same constitution and function. The water rinse vessels each comprise a box-shaped inner vessel 52 of a size sufficient to contain a wafer group WS and is supplied with DIW from DIW supply means 80 which will be described later. The processing vessel groups M1, M2, M3 comprising the chemical liquid vessels P1, P2, P3 and the water rinse vessels R1, R2, R3 have the same constitution and function.

Figure 7:
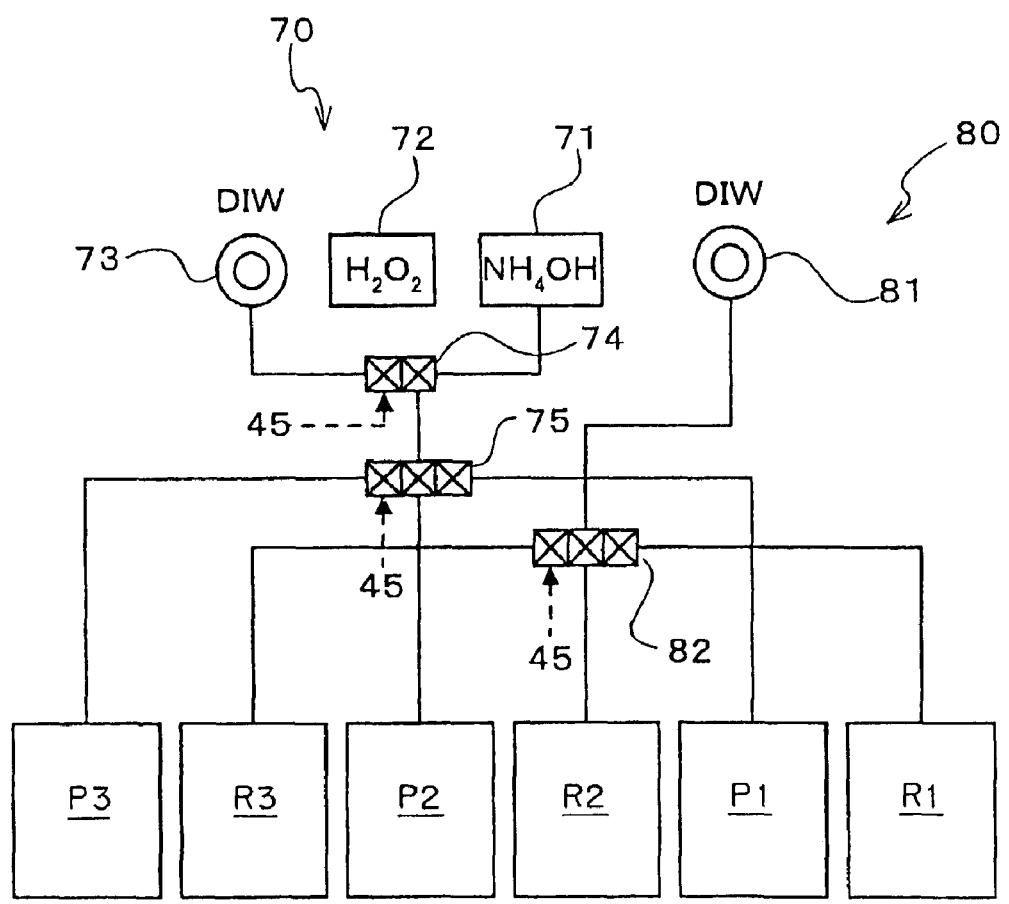
FIG. 7 is a view explaining the chemical liquid supply means and the DIW supply means.

FIG. 7 is a view explaining the supply circuit of processing liquids. The chemical liquid supply means 70 supplies to any one of the chemical liquid vessels P1, P2, P3 a chemical liquid which has been adjusted to a prescribed concentration by the mixing valve 74 by the change-over of the change-over valve 75. DIW supply means 80 includes a DIW supply source 81 and a change-over valve 82 and supplies DIW supplied from a DIW supply source 81 to any one of the water rinse vessels R1, R2, R3 by changing over the change-over valve 82. The adjustment of the concentration and the change-over are performed based on control signals of the control unit 45. In the chemical liquid supply means 70, a position at which DIW is flowed into the mixing valve 74 is upstream of a position at which $NH_4OH$ and $H_2O_2$ are flowed into the mixing valve 74, so that the DIW urges the $NH_4OH$ and $H_2O_2$ to flow out of the mixing valve 74 to wash the interior of the mixing valve 74.

The drying unit 8 comprises a water cleaning vessel 24 and a chuck cleaning mechanism 26 for cleaning the chucks 28a–28c of the wafer transport means 22. Above the water cleaning vessel 24 there is provided a drying chamber (not shown) to which vapor of isopropyl alcohol (IPA), for example, is fed to dry a wafer group WS. An intra-drying unit transport means 25 which transports a wafer group WS between the water cleaning vessel 24 and the drying chamber is provided, and a wafer group WS which has been water cleaned in the water cleaning vessel 24 is lifted by the intra-drying unit transport means 25 to be dried with IPA in the drying chamber. The intra-drying unit transport means 25 has the same constitution as the above-described first intra processing vessel group transport means 40 except that the intra-drying unit transport means 25 cannot be moved in the X-direction, and can transfer a wafer group WS to and from the wafer transport means 22. As shown in FIG. 3, output signals (control signals) of the control unit 45 are supplied to the water cleaning vessel 24, the intra-drying unit transport means 25, the drying chamber, etc. When the water cleaning vessel 24, the intra-drying unit transport means 25, the drying chamber, etc. malfunction, the control unit 45 automatically detects the malfunctioning state.

Next, the processing steps of wafer groups WS by the processing system according to the present embodiment having the above-described constitution will be explained. First, the step of preparing in advance the processing recipes RE1, RE2, RE3 is performed. An operator inputs sequences of the processing steps of the wafer groups WS to thereby prepare and input the processing recipe RE0. The processing recipe RE0 is stored by the memory unit 48.

On the other hand, carriers C each containing 25, for example, wafers W to be processed are loaded into the processing system 1. First, a carrier robot not shown mounts the carriers C on the carrier load in/out unit 5. The shutter 14 is opened, and the carriers C mounted on the carrier load in/out unit 5 are loaded into the carrier stock unit 6 by the carrier transport means 12. The carrier stock unit 6 stores a plurality of the carriers C holding wafers W to be processed.

In the carrier stock unit 6, the stored carriers C containing wafers to be processed are mounted on the detection/load in/out stage 15 to be opposed to the window 16. The window 16 is opened by the lid opening/closing mechanism 17 to count numbers of the wafers W in the carriers C and suitably detect whether or not the wafers are arranged one by one parallel with each other at a prescribed pitch. Then, the 25 wafers W contained in one carrier C are unloaded through the window 16 by the wafer load in/out means 19, and the 25 wafers W have the posture changed from the horizontal state to the vertical state by the posture changing mechanism 21a to be transferred to the wafer vertically holding mechanism 21b. Then, the 25 wafers are transferred from a second carrier C to the posture changing mechanism 21a by the load in/out means 19 and are transferred to the wafer vertically holding mechanism 21b. At this time, a pitch of arranging the wafers W is halved, so that the totally 50 wafers which have been contained in the two carriers C form a wafer group WS1. Then, the wafer transport means 22 receives the wafer group WS1 from the wafer vertically holding mechanism 21b and loads the wafer group WS1 into the liquid processing unit 4 after a suitable stand-by in the parking areas 9a, 9b.

When the wafer group WS1 is loaded into the liquid processing apparatus 7 of the liquid processing unit 4, the control unit 45 monitoring the wafer load in/out means 22 detects the load of the wafer groups WS1 to be processed. Then, the computer 47 applies the processing recipe RE0 to the wafer group WS1 to be processed and selects the processing vessel group for executing the processing recipe RE0. Thus, the processing recipe RE1 is applied to the wafer group WS1 to be processed. Subsequently, the controller 50 reads the processing recipe RE1 from the computer 47 and, in accordance with the processing recipe RE1, gives the wafer transfer means 22 a command that the wafer group WS1 be transferred to the first intra-processing vessel group transport means 40.

When the wafer group WS1 is transferred from the wafer transportation apparatus 22 to the first intra-processing vessel group means 40, the first intra-processing vessel group transportation apparatus 40 lowers and immerse the wafer group WS1 into SC-1 liquid in the chemical liquid vessel P1. The SC-1 liquid has been supplied in advance by the chemical liquid supply means 70 and stored, and is caused to flow through the circulatory supply circuit 54 by the operation of the pump 56 to thereby have the temperature adjusted and purified by the temperature controller 58 and the filter 60. The pump 56 is operated to circulate the chemical liquid to immerse the wafer group WS1 and remove adhering objects, such as particles, etc. After a prescribed period of time, in response to a command corresponding to the processing recipe RE1, the intra-processing vessel group transportation apparatus 40 lifts the wafer group WS.

Next, the intra-processing vessel group transportation apparatus 40 is moved to above the water rinse vessel R1, and lowers and immerse the wafer group WS1 into DIW. In the water rinse vessel R1, the wafer group WS1 is immersed in the DIW circulated by the operation of the pump 56 to remove the chemical liquid staying on the wafer group WS1 during the cleaning processing. After a prescribed period of time, the intra-processing vessel transportation apparatus 40 which has received a command corresponding to the processing recipe RE1 lifts the wafer group WS1. The wafer group WS1 which has completed the processing in the water rinse vessel R1 is returned to the chuck 28a–28c of the water transportation means 22 above the water rinse vessel R1 and the is unloaded out of the liquid processing apparatus 7 by the water transportation apparatus 22.

The wafer transportation apparatus 22 unloads the wafer group WS1 out of the liquid processing apparatus 7 to transport the wafer group WS1 into the drying unit 8. In the drying unit 8, the wafer group WS1 is water-rinsed in the water rinse vessel 24 and then lifted by the intra-drying unit transportation apparatus 25 to be IPA-dried in the drying chamber. The wafer group WS1 which has been dried is unloaded out of the liquid processing unit 4 by the wafer transportation apparatus 22 and returned to the interface unit 3 to have the pitch and the posture changed. The wafers W1 forming the wafer group WS1 are contained in the carriers C, and the carriers C containing the processed wafers W1 are mounted on the carrier load in/out unit 5 to be unloaded out of the processing system 1.

The above is the processing steps of processing the wafer group WS1 by the processing system 1. When the processing recipes RE2, RE3 are applied to wafer groups WS to be processed, the same processing steps as described above are performed. That is, wafers W to be processed follow the same step of forming wafer groups WS as in applying the processing recipe RE1, and the wafer groups WS are transferred from the wafer transportation apparatus 22 to the respective intra-processing vessel group transportation apparatus 41, 42. The wafer groups WS are immersed in SC-1 liquid which has been in advance supplied from the chemical liquid supply means 70 to the respective chemical liquid vessels P2, P3 to be subjected to the cleaning processing. After a prescribed period of time of the cleaning processing, the wafers groups WS are transported into the respective water rinse vessels R2, R3 by the respective intra-processing vessel group transportation apparatus 41, 42 and are immersed in DIW which has been supplied in advance from the DIW supply means 80 and stored in the respective water rinse vessels R2, R3 to be subjected to the water rinse processing. After a prescribed period of time of the water rinse processing, the wafer groups WS are transferred to the wafer transportation apparatus 22. Then, the same drying step and unloading step of unloading the wafer groups WS out of the liquid processing unit 4 as in applying the processing recipe RE1 follow.

Next, the steps of processing a plurality of wafer groups WS1, WS2, WS3, . . . in parallel with one another will be explained. For example, the wafer group WS2 stored in the carrier stock unit 6 is loaded into the interface unit 3 to have the pitch and the posture changed. The wafer transportation apparatus 22 which has transferred the wafer group WS1 to the first intro-processing vessel group transportation apparatus 40 receives and the wafer group WS2, which is to be next processed and loads it into the liquid processing unit 4. Then, the computer applies the processing recipe RE2 to the wafer group WS2 to be processed. Subsequently, the controller 50 reads the processing recipe RE2 from the computer 47 and in accordance with the processing recipe RE2, gives to the wafer transfer means 22 a command that the wafer group WS2 be transferred to the second intra-processing vessel group transportation apparatus 41. When the wafer group WS2 is transferred from the wafer transportation apparatus 22 to the second intra-processing vessel group transportation apparatus 41, the second intra-processing vessel means 41, which has received the command corresponding to the processing recipe RE2 lowers the wafer group WS2 to subject the wafer group WS2 to the step of immersing the wafer group WS2 in SC-1 liquid to remove adhering objects, such as particles, etc. Thus, while the wafer group WS1 is being subjected to the cleaning processing or the water rinse processing in the processing vessel group M1, the cleaning processing on the wafer group WS2 in the processing vessel M2 is started. Thus, the processing on the wafer group WS1 based on the processing recipe RE1 and the processing of the wafer group WS2 based on the processing recipe RE2 are performed in parallel with each other.

Furthermore, the wafer transportation means 22 transfers the wafer group WS2 to the second intra-processing vessel group transportation means 41 and then receives the wafer group WS3 to be next processed to load the wafer group WS3 into the liquid processing unit 4. Then, the computer 47 applies the processing recipe RE3 to the wafer group WS3 to be processed. Subsequently, the controller 50 reads the processing recipe RE3 from the computer 47 and gives to the wafer transportation means 22 a command that the wafer group WS3 be transferred to the third intra-processing vessel group transportation means 42. When the wafer group WS3 is transferred from the wafer transportation means 22 to the third intra-processing vessel group transportation means 42, the third intra-processing vessel group transportation means 42 which has received the command in accordance with the processing recipe RE3 performs the step of lowering the wafer group WS3 and immersing the wafer group WS3 in the SC-1 liquid to remove staying objects, such as particles, etc. Thus, the cleaning processing or water rinse processing is performed in the processing vessel group M1, and while the cleaning processing or the water rinse processing is being performed, the cleaning processing is started in the processing vessel group M3. The processing of the wafer group WS1 in accordance with the processing recipe RE1, the processing of the wafer group WS2 in accordance with the processing recipe RE2, and the processing of the wafer group WS3 in accordance with the processing recipe RE3 go on parallel with one another.

As described above, in the processing recipes RE1, RE2, RE3, the processing vessel groups M1, M2, M3 are sequentially selected to execute the processing recipe RE0 applied to the loaded wafer groups WS, the wafer groups WS are transported respectively to the processing vessel group M1, the processing vessel group M2 and the processing vessel group M3. Then, the processing is started in the order of the processing vessel groups M1, M2, M3, and after respective period of time, the cleaning processing and the water rinse processing are completed in the order of the processing vessel groups M1, M2, M3. That is, in the order of the transportation, the wafer groups WS1, WS2, WS3 are loaded and start to be processed, and the processing advances in the order of the processing groups WS1, WS2, WS3.

The wafer transportation apparatus 22 loads the wafer group WS3 into the third processing vessel group M3 before the processing in the first processing vessel group M1 which is first completed is completed. Then, the wafer group WS1 in the first processing vessel group M1 is received by the chucks to be unloaded out of the liquid processing apparatus 7 to be transported into the drying unit 8. In the drying unit 8, the wafer group WS1 is immersed in the water rinse vessel 24. Then, the wafer group WS1 is water rinsed and then lifted by the intra-drying unit transportation apparatus 25, and the IPA drying is started in the drying chamber.

On the other hand, in the interface unit 3, the wafer vertically holding mechanism 21b is changing the pitch and the posture of the fresh wafer group WS4 to be processed. The wafer transportation apparatus 22 which has transferred the wafer group WS1 into the wafer rinse vessel 24 of the drying unit 8 returns tot he interface unit 3 to receive the wafer group WS4 from the vertically holding mechanism 21b and loads the wafer group WS4 into the liquid processing unit 4.

In the liquid processing unit 4, the first processing vessel group M1 out of which the wafer group WS1 has been unloaded is standing usable. In the second processing vessel group M2 and the third processing vessel group M3, the cleaning processing or the water rinse processing is being performed respectively in accordance with the processing recipes RE2, RE3. As the processing vessel group for executing the processing recipe RE0 applied to the wafer group WS4 to be loaded into the liquid processing unit 4, the processing vessel group M1 is again selected. Accordingly, the wafer group WS4 is transported to the first processing vessel group M1 to be processed in accordance with the processing recipe RE1. Thus, the processing of the wafer groups WS2, WS3, WS4 are performed in parallel with one another. That is, the second processing vessel group M2 processes the wafer group WS2 in accordance with the processing recipe RE2, the third processing vessel group M3 processes the wafer group WS3 in accordance with the processing recipe RE2, and the first processing vessel group M1 processes the wafer group WS4 in accordance with the processing recipe RE1. The processing advances in the order of the load, i.e., in the order of the wafer groups WS2, WS3, WS4. For example, the wafer group WS2 is water rinsed in the second water rinse vessel R2, the wafer group WS3 is being cleaning-processed in the third chemical liquid vessel P3, and the wafer group WS4 starts to be cleaned in the first chemical liquid vessel P1.

In the drying chamber of the drying unit 8, the IPA drying of the wafer group WS1 is going on. Before a prescribed period of time of the drying processing of the wafer group WS1, the wafer transportation apparatus 22 which has loaded the wafer group WS4 into the liquid processing unit 4 is moved to a prescribed position in the drying unit 8. Then, the wafer transportation apparatus 22 receives the wafer group WS1 which has completed the drying processing with IPA and transfers the wafer group WS1 to the wafer vertically holding mechanism 21b of the interface unit 3.

Then, a prescribed period of time of the processing in the second processing vessel group M2 has passed, and the wafer group WS2 is unloaded. Then, as has been the wafer group WS1, the wafer group M2 is unloaded out of the liquid processing apparatus 7 and starts to be drying processed in the drying processing unit 8. In a prescribed period of time of drying-processing the wafer group WS2, the wafer group WS5 is loaded into the liquid processing unit 4 by the wafer transportation apparatus 22. Then, the processing recipe RE2 is applied to the wafer group WS5, and is transferred to the second processing vessel group M2 and starts to be processed. Thus, the processing of the wafers groups WS3, WS4, WS5 are performed in parallel with one another. That is, the third processing vessel group M3 processes the wafer group WS3 in accordance with the processing recipe RE3, the first processing vessel group M1 processes the wafer group WS4 in accordance with the processing recipe RE1, and the second processing vessel group M2 processes the wafer group WS5 in accordance with the processing recipe RE2. The processing advances in the order of the load, i.e., the wafer groups WS3, WS4, WS5. For example, the wafer group WS3 is water rinsed in the third water rinse vessel R3, the wafer group WS4 is cleaning-processed in the first chemical liquid vessel P1, and the wafer group WS5 starts to be cleaning-processed in the second chemical liquid vessel P2. Before a period of time of the drying processing of the wafer group WS2, the wafer transportation apparatus 22 is moved to a prescribed position in the drying unit 8, receives the wafer group WS2 which has completed the drying processing with IPA and transfers the wafer group WS2 to the wafer vertically holding mechanism 21b.

As described above, a plurality of the processing vessel groups M1, M2, M3 which have the same constitution and function and perform the same processing are provided, whereby a plurality of the wafer groups WS can be processed in parallel with one another. The processing vessel groups M1, M2, M3 have the respective intra-processing vessel group transportation apparatus 40, 41, 42, whereby the wafer transportation apparatus 22 can efficiently transport the wafer groups WS to the processing vessel groups M1, M2, M3. Thus, a plurality of wafer groups WS to be processed are continuously loaded in and are processed in parallel with one another, and the processed wafer groups WS are continuously unloaded, whereby high throughputs can be obtained.

When processing liquids have to be replaced due to a lifetime of a chemical liquid stored in the chemical liquid vessels and immersion times of wafer groups WS, the wafer groups WS are unloaded out of the respective processing vessel groups M1, M2, M3, and the processing liquids are replaced. When a chemical liquid in the chemical liquid vessels P1, P2, P3 can be replaced in the steps of continuously processing a plurality of wafer groups WS, the chemical liquid is concurrently replaced after the processing recipes RE1, RE2, RE3 are executed in a prescribed number of rounds of the processing recipes RE1, RE2, RE3. That is, because the processing recipes RE1, RE2, RE3 are sequentially applied to wafer groups WS, times of executing the processing recipes RE1, RE2, RE3 and times of immersing the wafer groups WS in the respective chemical liquid vessels P1, P2, P3 and the water rinse vessels R1, R2, R3 are the same. That is, when the processing recipes RE1, RE2, RE3 are executed X times, times of immersing wafer groups WS in the chemical liquid vessels P1, P2, P3 and the water rinse vessels R1, R2, R3 are respectively X times. Accordingly, after the X-th processing recipe RE1 in the processing vessel group M1 is completed, the X+1-th processing recipe RE1 is not executed, and the processing vessel group M1 is not loaded with a wafer group but stands by. Similarly, after the X-th processing recipe RE2 is completed, the processing vessel group M2 is not loaded with a wafer group WS but stands by. After the processing recipe rE3 is completed, the wafer group WS is unloaded out of the processing vessel group M3, and then a chemical liquid in the chemical liquid vessels P1, P2, P3 is discharged, and a chemical liquid is supplied to the chemical liquid vessels P1, P2, P3 from the chemical liquid supply means 70.

Normally, the processing vessel groups for executing the processing recipe RE0 applied to wafer groups WS are selected when, as described above, the wafer groups WS are loaded into the liquid processing unit 4. If any one of the chemical liquid vessels P1, P2, P3 and the water rinse vessels R1, R2, R3 and the intra-processing vessel group transportation apparatus 40, 41, 42 should unusably malfunction, that of the processing vessel groups M1, M2, M3 having the malfunctioning chemical liquid vessel P1, P2, P3 or the malfunctioning water rinse vessel R1, R2, R3, or that of the processing vessel group M1, M2, M3 having the malfunctioning intra-processing vessel group transportation apparatus 40, 41, 42, which transports a wafer group WS must be removed as an unusable processing vessel group from the selection. That is, that of the processing vessel groups M1, M2, M3, which is unusable is removed, and those of the remaining processing vessel groups are selected.

First, the control unit 45 automatically detects that that of the chemical liquid vessels P1, P2, P3, the water rinse vessel R1, R2, R3 and the intra-processing vessel group transportation apparatus 40, 41, 42 malfunctions to thereby identify the malfunctioning chemical liquid vessel P1, P2, P3, the malfunctioning water rinse vessel R1, R2, R3 or the intra-processing vessel transportation apparatus 40, 41, 42. For example, an operator may make in the control unit 45 an input identifying that of the chemical liquid vessels P1, P2, P3, that of the water rinse vessels R1, R2, R3 or that of the intra-processing vessel group transportation apparatus 40, 41, 42. The computer 47 identify that of the processing vessel group, which is unusable, based on the malfunctioning chemical liquid vessel P1, P2, P3, the malfunctioning water rinse vessel R1, R2, R3 and the malfunctioning intra-processing vessel group transportation apparatus 40, 41, 42. Then, the identified processing vessel group can be stored in the memory unit 48 as an object to be removed. When the processing vessel group for executing the processing recipe RE0 applied to a loaded wafer group WS is selected, the processing vessel groups are selected with the unusable processing vessel group removed. Thus, the control unit 45 can select the processing vessel groups with the processing group which has been judged unusable removed.

For example, in a case that the second chemical liquid vessel P2 unusably malfunctions, the computer 47 judges that the processing vessel group M2 having the second chemical liquid vessel P2 is unusable, and the processing recipe RE2 which controls the processing vessel group M2 is unusable, and stores in the memory unit 48 that the processing recipe RE2 is to be removed. On the other hand, when the processing recipe RE2, which is to be removed, occurs in a sequence, the computer 47 ignores the processing recipe RE2 and applies the next processing recipe RE3 to a wafer group WS. For example, when an operator makes in the input/output means 46 an input indicating that wafer groups WS to be continuously loaded and to be processed in accordance with the same processing recipe RE0, and the computer 47 judges the processing recipes to be applied to the respective wafer groups WS, based on the processing recipe route [(1) the processing recipe RE1, (2) the processing recipe RE2, (3) the processing recipe RE3], the currently used processing recipe route is not changed, but the condition of the object to be removed is newly added. Based on the currently used processing recipe route and the condition of the object to be removed and with the unusable processing recipe removed, the computer 47 applies the rest processing recipes to the respective wafer groups WS. Thus, the computer 47 applies the processing recipe RE3 following the processing recipe RE1, and the processing recipe route to be executed is [(1) the processing recipe RE1, (2) the processing recipe RE3]. Accordingly, when wafer groups WS are continuously loaded into the liquid processing unit 4, the processing recipes RE1, RE3 are alternately to the respective wafer groups WS, and the processing vessel group M1 for performing the processing in accordance with the processing recipe RE1 and the processing vessel group M3 for the processing in accordance with the processing recipe RE3 are alternately selected for the processing. As described above, if any one of the processing vessels becomes unusable, the other processing recipes are automatically applied to wafer groups WS, whereby the processing can be made by using usable processing vessels. Accordingly, even if any one of the processing vessels should become unusable, the processing steps are continued, whereby decrease of throughputs can be depressed.

According to the processing system described above, the computer 47 selects, based on processing recipes inputted by an operator, those of the processing vessel groups M1, M2, M3 for executing the processing recipe RE0 inputted by an operator. That is, the computer 47 judges which of the chemical liquid vessels P1, P2, P3, the water rinse vessels R1, R2, R3, and the drying unit 8 to be used in executing the processing recipe RE0 inputted by the operator. Accordingly, the operator does not have to judge which of the chemical liquid vessels P1, P2, P3, the water rinse vessels R1, R2, R3, and the drying unit 8 to be used in executing processing recipes. Thus, the inputting operation by the operator can be simplified, the interruption of the processing steps due to inputting mistakes or judging mistakes of the operators can be precluded, whereby decrease of the throughputs can be depressed. Two or more wafer groups WS can be processed in parallel with each other, whereby a plurality of wafer groups WS can be continuously processed, whereby high throughputs can be obtained. Even if any one of the chemical processing vessels P1, P2, P3, the water rinse vessels R1, R2, R3 and the intra-processing vessel group transportation apparatus 40, 41, 41 should be malfunction while a plurality of wafer groups WS are being processed, processing recipes for the rest processing vessel groups will be automatically applied to the wafer groups WS to thereby process the wafer groups WS by the usable processing vessel groups M1, M2, M3 without interrupting the processing steps. Accordingly, decrease of throughputs can be depressed.

One example of preferable embodiments of the present invention has been explained above, but, needless to say, the present invention is not limited to the above-described embodiment and can cover suitable modifications. For example, the mixing valve of the chemical liquid supply means is provided in each of the processing vessel groups M1, M2, M3, and the mixing valves adjust prescribed concentrations of a chemical liquid for the respective processing vessels M1, M2, M3 and are opened to supply the chemical liquid.

Figure 8:
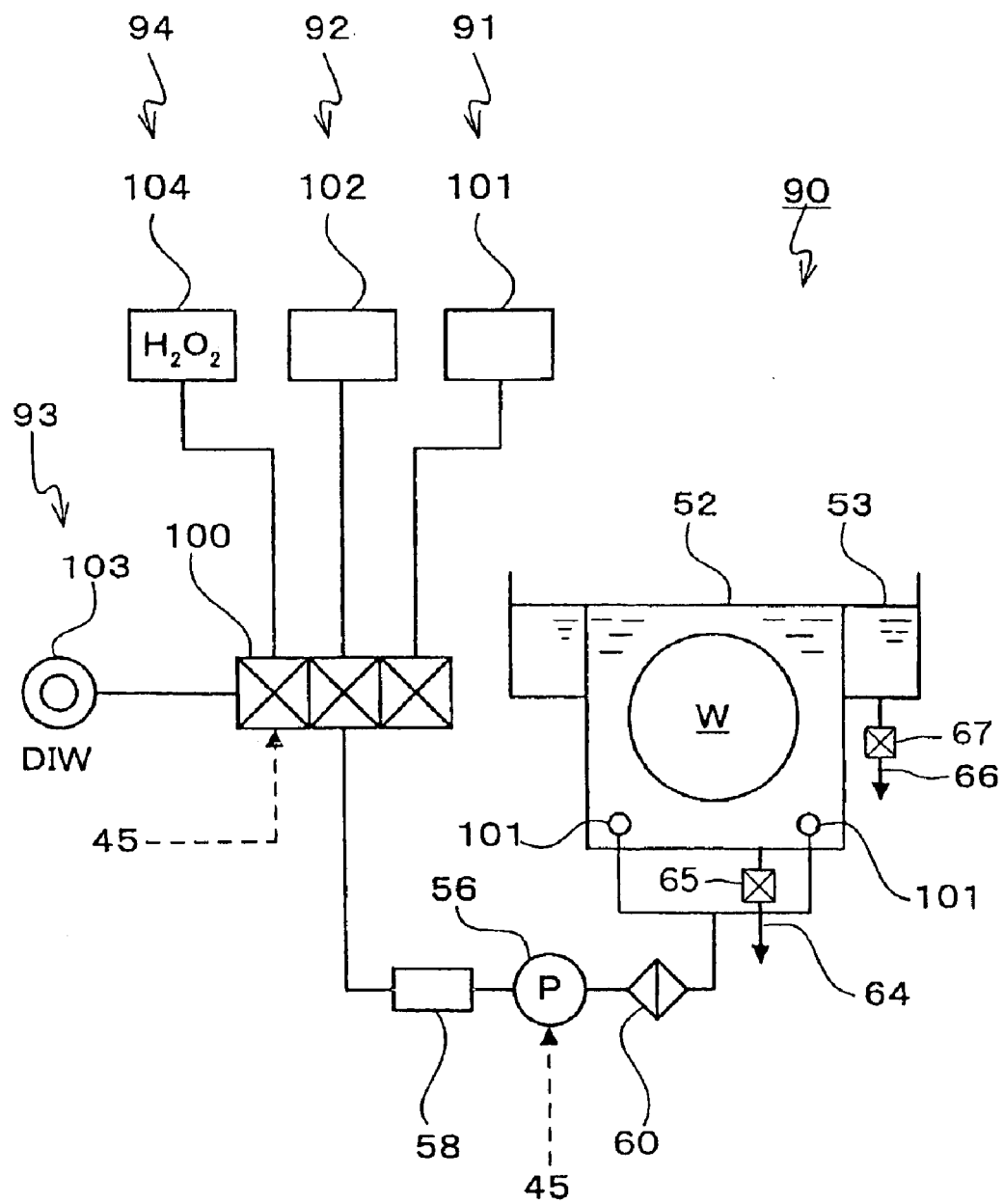
FIG. 8 is a view explaining the POU-type processing vessel.

The processing vessels may be processing vessels of POU type (one pass type) that can perform both the cleaning processing and the water rinse processing. As shown in FIG. 8, the POU processing vessel 90 comprises an inner vessel 52 and an outer vessel 53, as does the chemical liquid vessel P3, and chemical liquid supply means for the POU processing vessel 90 comprises, e.g., ammonium supply means 91, sulfuric acid supply means 92 and DIW supply means 93 and $H_2O_2$ supply means 94. The ammonium supply means 91 comprises an ammonium supply tank 101 for storing ammonium, and a mixing valve 100. The sulfuric acid supply means 92 comprises a sulfuric acid supply tank 102 for storing sulfuric acid, and the mixing valve 100. The DIW supply means 93 comprises a DIW supply source 103 as a pure water supply source, and the mixing valve 100. The $H_2O_2$ supply means 94 comprises a $H_2O_2$ supply tank 104, and the mixing valve 100. The mixing valve 100 is connected as signal output means to the control unit 45, and, in response to control signals from the control unit 45, selects ammonium, sulfuric acid, $H_2O_2$ or DIW as a chemical liquid to be fed to wafer groups WS and changed over to flow the chemical liquid to nozzles 101 disposed in the bottom of the inner vessel 52. The processing liquid flowing from the mixing valve 100 is fed from the nozzles 101 to wafer groups WS in the inner vessel 52. The mixing valve 100 can select, in response to control signals from the control unit 45, ammonium or sulfuric acid, $H_2O_2$ or DIW and prepare a prescribed concentration of the processing liquid, and can flow the chemical liquid to the nozzles 101. When a chemical liquid is continuously supplied into the inner vessel 52 of the POU processing vessel 90, the processing liquid flows into the outer vessel 53 and drained through a drain pipe 66 connected to the outer vessel 53 via a valve 67. In the POU processing vessel 90, for example, wafer groups WS are processed first with ammonium supplied from the ammonium supply means 91, and the ammonium is discharged from the inner vessel 52 through a discharge pipe 64 provided in the bottom of the inner vessel 51 via a valve 65. Then, DIW is supplied to the wafer groups WS by the DIW supply means 93 to water rinse the wafer groups WS. DIW is flowed into the mixing valve 100 at a position more upstream of a position where ammonium, sulfuric acid and $H_2O_2$ are flowed into the mixing valve 100, so that the DIW flows away ammonium, sulfuric acid and $H_2O_2$ out of the mixing valve 100 to thereby clean the inside of the mixing valve 100 with water.

In using the POU processing vessel 90, when an operator knows a sequence of supplying the processing liquids, he inputs the sequence in the input/output means 46, whereby input signals can be supplied to the control unit 45. Then, the computer 47 prepares processing recipes based on the sequence of the processing liquids and applies the processing recipes to wafer groups WS in accordance with a processing recipe route based on the sequence of the processing liquids. The controller 50 controls the mixing valve 100 for the processing liquids, the valve 67 and the valve 65 to thereby control the supply and discharge of the processing liquids. Thus, the POU processing vessel 90 can process the wafer groups WS in accordance with the processing recipes. In this case, processing in the chemical liquid vessel and processing in the water rinse vessel can be performed in one processing vessel, which can save space.

Figure 9:
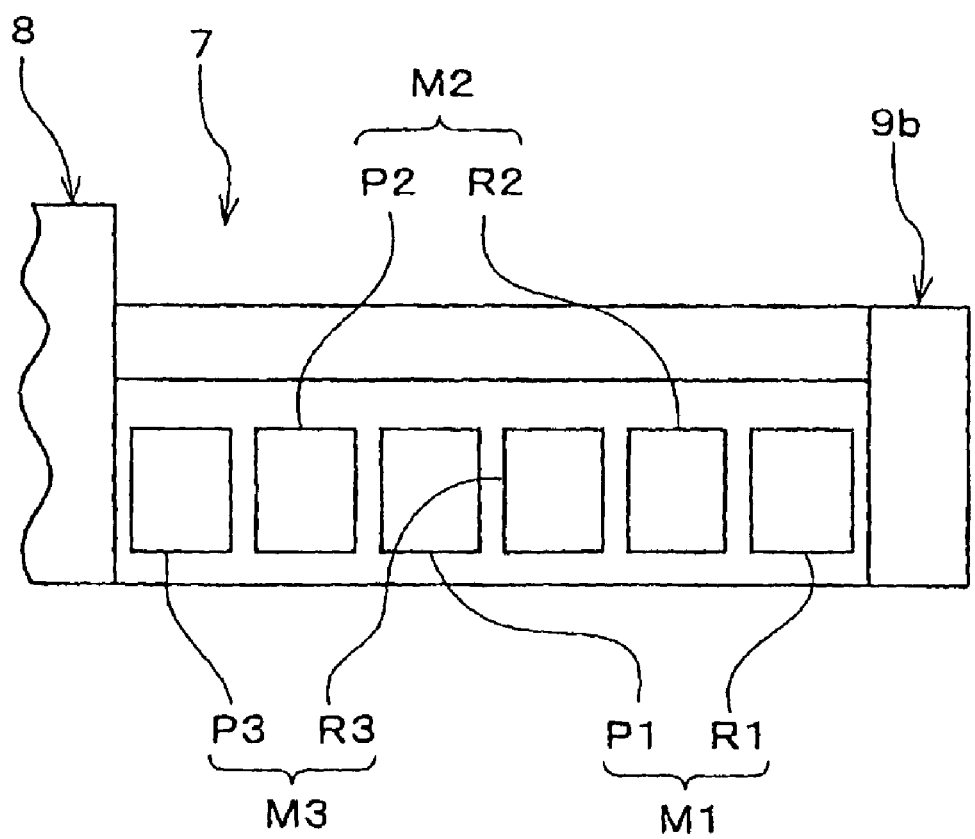
FIG. 9 is a plan view of a modification of the arrangement of the processing vessels.

The arrangement of the processing vessels can be suitably changed. For example, the chemical liquid vessels P1, P2, P3 may be adjacent to each other, and the water rinse vessels R1, R2, R3 may be adjacent to each other. In the example shown in FIG. 9, the water rinse vessels R1, R2, R3 and the chemical liquid vessels P1, P2, P3 are arranged as the stated order from the side of the parking area 9b. The chemical liquid vessel P1 and the water rinse vessel R1 forms the processing vessel group M1, the chemical liquid vessel P2 and the water rinse vessel R2 form the processing vessel group M2, and the chemical liquid vessel P3 and the water rinse vessel R3 form the processing vessel group M3. That is, wafer groups WS are processed in the processing vessel groups controlled by applied processing recipes. For example, wafer groups WS cleaned in the chemical liquid vessel P1 is transported to the water rinse vessel R2 to be water rinsed there. The intra-processing vessel group transportation for transporting wafer groups WS form the chemical liquid vessels to the water rinse vessels are suitably disposed. Processing recipes are automatically applied to wafer groups WS, and a plurality of wafer groups WS can be continuously processed.

The present invention is not limited to the processing system to which cleaning liquids are supplied, and the processing system can be perform processing other than cleaning processing with other various processing liquids on substrates. Objects to be processed are not limited to semiconductor wafers and can be glasses for LCD substrates, CD substrates, printed circuit boards, ceramic substrate, etc. other than semiconductor substrates.

According to the processing system and the processing method according to the present invention, interruption of processing steps due to input mistakes and judging mistakes by operators can be precluded, and decrease of throughputs can be depressed. A plurality of wafer groups can be continuously processed, whereby high throughputs can be obtained.

What is claimed is:

1. A processing system for processing at least one object group comprising at least one object-to-be-processed in a processing vessel with a processing liquid, said processing system comprising:
- a plurality of processing vessel groups, which can perform the same processing, each comprising at least one processing vessel;
- a transportation apparatus for transporting object groups to the plurality of processing vessel groups; and
- a control unit for selecting the processing vessel groups for the object groups to be transported to, said control unit having an applying function of applying processing recipes to the object groups transported continuously to the processing vessel groups and a selecting function of selecting the processing vessel groups in a prescribed sequence for executing the respective applied processing recipes.

2. The processing system according to claim 1, wherein the plurality of processing vessel groups respectively include processing vessels which can process the object groups with the same processing liquids.

3. The processing system according to claim 1, wherein the control unit has a storing function of storing the processing recipes.

4. The processing system according to claim 1, wherein the control unit has a judging function of judging whether or not each of the respective processing vessel groups is usable.

5. The processing system according to claim 4, wherein the control unit selects the processing vessel groups except a processing vessel group the control unit has judged unusable.

6. The processing system according to claim 1, wherein at least one supply pipe for supplying the processing liquid is provided for the processing vessels.

7. The processing system according to claim 6, wherein a plurality of supply pipes for supplying different kinds of processing liquids to one of the processing vessels.

8. The processing system according to claim 1, wherein the control unit controls the processing of the respective processing vessel groups so that the processing liquids in the processing vessels of the processing vessel groups can be concurrently replaced.

9. A processing system for processing at least one object group comprising at least one object-to-be-processed in a processing vessel with a processing liquid, said processing system comprising:
- an input unit for an operator to input processing recipes;
- a plurality of processing vessel groups, which can perform the same processing, each comprising at least one processing vessel;
- a transportation apparatus for transporting object groups to the plurality of processing vessel groups; and
- a control unit which, when the processing recipes inputted by the input unit are the same for the plurality of processing vessel groups, selects the processing vessel groups for executing the same processing recipe in a prescribed sequence and controls the transportation apparatus to transport the respective object groups to the processing vessel groups selected in the prescribed sequence.

10. The processing system according to claim 9, wherein the plurality of processing vessel groups respectively include processing vessels which can process the object groups with the same processing liquids.

11. The processing system according to claim 9, wherein the control unit has a storing function of storing the processing recipes.

12. The processing system according to claim 9, wherein the control unit has a judging function of judging whether or not each of the respective processing vessel group is usable.

13. The processing system according to claim 12, wherein the control unit selects the processing vessel groups except a processing vessel group the control unit has judged unusable.

14. The processing system according to claim 9, wherein the control unit controls the processing of the respective processing vessel groups so that the processing liquids in the processing vessels of the processing vessel groups can be concurrently replaced.

15. A processing method for transporting at least one object group comprising at least one object-to-be-processed to a plurality of processing vessel groups, each comprising at least one processing vessel, to process the object group in the at least one processing vessel with a processing liquid, said method comprising:
- selecting sequentially different processing vessel groups out of a plurality of the processing vessel groups for processing object groups transported continuously thereto and processing the object groups in the selected processing vessel groups in accordance with prescribed processing recipes.

16. The processing method according to claim 15, wherein the plurality of processing vessel groups respectively include processing vessel groups for processing the object groups in accordance with the same processing recipe.

17. The processing method according to claim 15, wherein the plurality of object groups are processed in parallel.

18. The processing method according to claim 15, wherein the processing vessel groups except processing vessels which have been judged unusable are selected.

19. The processing method according to claim 15, wherein the processing of the respective processing vessel groups is controlled so that the processing liquids in the processing vessels of the processing vessel groups can be concurrently replaced, and sequentially different processing vessel groups can be automatically selected when a plurality of object-to-be-processed, which will be processed in accordance with the same processing recipe, are transported to the processing vessel groups.

* * * * *